United States Patent [19]

Fujiwara

[11] 4,360,965
[45] Nov. 30, 1982

[54] METHOD OF MOUNTING A SEMICONDUCTOR LASER DEVICE

[75] Inventor: Kanji Fujiwara, Kawasaki, Japan

[73] Assignee: Fujitsu Limited, Kawasaki, Japan

[21] Appl. No.: 202,438

[22] PCT Filed: Nov. 28, 1979

[86] PCT No.: PCT/JP79/00302

§ 371 Date: Aug. 1, 1980

§ 102(e) Date: Jul. 30, 1980

[87] PCT Pub. No.: WO80/01222

PCT Pub. Date: Jun. 12, 1980

[30] Foreign Application Priority Data

Dec. 1, 1978 [JP] Japan .............................. 53-148839

[51] Int. Cl.³ .............................................. H01L 21/18
[52] U.S. Cl. .................................... 29/582; 29/569 L; 29/581; 29/589; 29/590
[58] Field of Search ................... 29/569 L, 589, 590, 29/581, 582

[56] References Cited

U.S. PATENT DOCUMENTS

| | | | |
|---|---|---|---|
| 3,255,511 | 6/1966 | Weissenstern et al. | 29/589 |
| 3,396,454 | 8/1968 | Murdoch et al. | 29/589 X |
| 3,634,931 | 1/1972 | Kano et al. | 29/589 |
| 3,769,694 | 11/1973 | Collins et al. | 29/589 |
| 3,824,133 | 7/1974 | D'Asaro et al. | 29/589 X |
| 3,893,229 | 7/1975 | Aird | 29/589 |
| 3,922,775 | 12/1975 | Potter | 29/589 |
| 3,946,334 | 3/1976 | Yonezu et al. | 29/591 X |
| 4,123,293 | 10/1978 | Okikawa et al. | 29/590 X |

FOREIGN PATENT DOCUMENTS

1079033 8/1967 United Kingdom .
1426539 3/1976 United Kingdom .

OTHER PUBLICATIONS

Kadota et al., *Review of the Electrical Communication Laboratories*, vol. 25, No. 9–10, Sep.–Oct. 1977, Tokyo, Jpn., pp. 1052–1061.

*Laser Focus*, vol. 14, No. 3, Mar. 1978, N.Y., pp. 46–49.

*Primary Examiner*—G. Ozaki
*Attorney, Agent, or Firm*—Staas & Halsey

[57] ABSTRACT

A method of manufacturing a semiconductor laser device to be used for an optical communication system. A semiconductor laser device, with a heat sink comprising a diamond, is arranged on a heat radiation stud, which also serves as part of a vessel for hermetically sealing the semiconductor laser element. The semiconductor laser element is bonded to the heat sink, using a gold alloy layer previously formed on the surface of the heat sink. The semiconductor laser element is mounted on the gold alloy layer, with the heat sink heated to a temperature lower than the eutectic point temperature of the gold alloy layer. Then, the semiconductor laser element and the heat sink in contact with it are heated up to a temperature higher than the eutectic point temperature of the gold alloy layer. The elements are then cooled, thereby the semiconductor laser element is bonded to the heat sink. Thus, the operating life characteristics of a semiconductor laser device are improved by this method of manufacturing.

19 Claims, 10 Drawing Figures

METHOD OF MOUNTING A SEMICONDUCTOR LASER DEVICE

BACKGROUND OF THE INVENTION

This invention relates to a method of manufacturing semiconductor laser devices, and more particularly to a method of bonding a semiconductor laser element to a heat sink.

A semiconductor laser element composed of one of the following families of compound semiconductor materials, the gallium-arsenic (GaAs) family, the gallium-aluminum-arsenic (GaAlAs) family or the indium-gallium-arsenic-phosphor (InGaAsP) family, is currently being considered for practical applications for optical communication systems.

Such semiconductor laser elements can be practically applied to optical communication systems. These systems are required to have a high output power, long operational life and high reliability. In order to meet such requirements, it is essential to improve electrical characteristics of said semiconductor laser element and simultaneously efficiently release the Joule heat which is generated from the active layer of said semiconductor laser element being driven by a high current density.

As a means for improving dispersion of heat, it is proposed to use a diamond (Type IIa diamond), having a thermal conductivity about 5 times higher than that of copper at room temperature, as a heat sink material. The diamond replaces the metallic materials such as copper (Cu) or silver (Ag), etc., currently used as heat sink materials.

When mounting and bonding a semiconductor laser element on a diamond heat sink, it is required to mount and bond such semiconductor laser element without structurally degrading it, while ensuring satisfactory thermal and electrical coupling between the heat sink and the semiconductor laser element.

A diamond heat sink facilitates bonding and support of a semiconductor laser element with a metallized layer formed on the element's surface and provides the one lead-out electrode of said semiconductor laser element.

Certain conventional technological methods have been proposed to mount and bond a semiconductor laser element to a diamond heat sink on which surface a metallized layer is formed.

In other words, a first proposed method provides that a gold (Au) layer be formed as the metallized layer on the surface of said diamond heat sink and a semiconductor laser element is bonded to said gold layer by indium (In) soldering. This method is proposed because the mechanical distortion generated when the semiconductor laser element is bonded to a heat sink greatly affects the operating life of said semiconductor laser element. Bonding by means of the indium solder minimizes the mechanical distortion.

As a second method, it is proposed that a tin (Sn) layer be formed as the metallized layer on the surface of said diamond heat sink and a gold layer be formed on the bonding surface of the semiconductor laser element to be bonded therein and both the tin layer and the gold layer placed in contact and heated. Thus a gold-tin family eutectic crystalline alloy is generated, thereby bonding a semiconductor laser element to a diamond heat sink.

As a third method, it is proposed that a layer consisting of gold-antimony (Sb) or one of tin or indium-gold is formed on the surface of a diamond heat sink as the metallized layer, and a chromium (Cr)-gold layer is formed on the bonding surface of a semiconductor laser element. Both metallized layers are then placed in contact and heated under a pressured condition, thus the gold-antimony family eutectic crystalline alloy or gold-tin family eutectic crystalline alloy or gold-indium family eutectic crystalline alloy is generated, and the semiconductor laser element is bonded to the diamond heat sink.

As examples, the second and third methods are employed for analysis of thermal resistance, electrical resistance or mechanical properties of the semiconductor laser device when bonding by means of the gold family eutectic crystalline alloy is employed.

However, in the bonding structure or bonding means using the conventional indium solder of the first method, the bonding condition varies with age, particularly, the thermal resistance increases distinctively and therefore the drive current must be increased drastically to maintain the laser beam output level. This significantly reduces the operating life of the relevant laser element.

In the second method, where a gold layer is formed on the bonding surface of a semiconductor laser element, and a tin layer is formed on the surface of the heat sink and both layers are placed in contact and heated, the tin layer surface is likely to be oxidized before being placed in contact and heated. Therefore, satisfactory thermal and mechanical coupling between the semiconductor laser element and the heat sink cannot be obtained even if they are satisfactorily placed in contact and heated.

The third method presents a means to overcome this problem of the second method. Since the metallized layer formed on the surface of the heat sink has the multi-layered structure of, for example, gold-tin-gold or tin-gold where the tin (or antimony or indium) is not exposed and is covered with the gold, the tin (or antimony or indium) is not oxidized before the semiconductor laser element and heat sink are placed in contact and heated. However, this method requires an additional step, that is, the gold layer is formed covering the tin (or antimony or indium). This increases manufacturing processes. Therefore, such a method is not suitable for mass-production and has reduced desirability for producing less costly products.

SUMMARY OF THE INVENTION

It is an object of the present invention to offer a method of manufacturing a semiconductor laser device wherein a semiconductor laser element can be mounted and bonded to a heat sink with a low thermal resistance value and rigid mechanical coupling property.

It is another object of the present invention to offer a simplified method of manufacturing a semiconductor laser device where a semiconductor laser element can be bonded to a heat sink.

It is a further object of the present invention to offer a method of manufacturing a semiconductor laser device, including a method of bonding a semiconductor laser element to a heat sink that ensures a high output power and long operating life of the semiconductor laser element.

Accordingly, the present invention offers a method of manufacturing a semiconductor laser device where a metallized layer is formed on the bonding surface of a semiconductor laser element, which is then mounted on a heat sink having a layer of gold alloy on its surface and has been heated to a temperature lower than the eutectic point of said gold alloy layer. Once in contact, the combination is heated to a temperature higher than the eutectic point of said gold alloy layer until it is fused. The combination is then cooled and thus, semiconductor laser element is bonded to the heat sink.

DESCRIPTION OF THE PREFERRED EMBODIMENTS

The present invention presents a means for bonding a semiconductor laser element to a heat sink. A metallized gold alloy layer is first formed on the surface of the heat sink. Then the metallized layer formed on the bonding surface of the semiconductor laser element is pressed into contact with the gold alloy layer, and under the pressured condition heated. Thus the semiconductor laser element is bonded to the heat sink.

Since the metallized layer first formed on the surface of the heat sink is not easily oxidized and is structured by a single layer, bonding of a semiconductor laser element to the heat sink does not result in an insufficient thermal and mechanical coupling, or increase of manufacturing processes due to the existence of an oxide substance. Moreover, there is little variation of thermal resistance due to aging. Therefore, the operating life is greatly improved.

The gold alloy used in the present invention should be selected from the gold-tin family, gold-antimony family, gold-germanium family or gold-silicon family.

Figure 1:
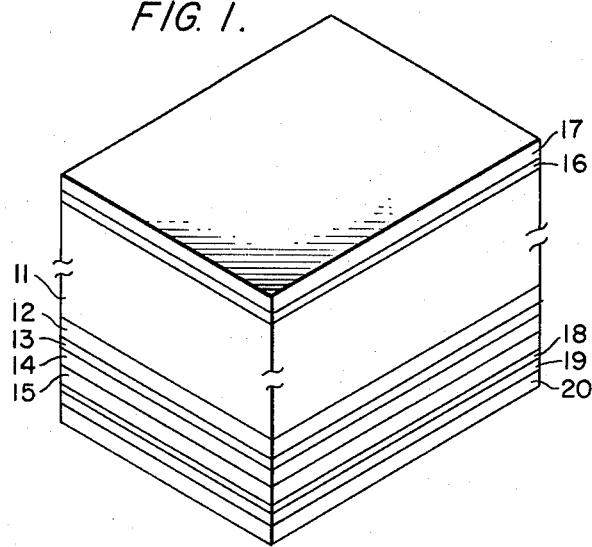
FIG. 1 is a perspective view of a typical semiconductor laser element.

FIG. 1 illustrates a semiconductor laser element to which the present invention is adopted.

In this figure, reference numeral 11 is an N-type gallium-arsenic (GaAs) substrate; 12 is a clad layer consisting of the N-type gallium-aluminum-arsenide ($Ga_{1-x}Al_xAs$) in the thickness of 1 (um); 13 is an active layer consisting of the P-type gallium-aluminum-arsenide ($Ga_{1-y}Al_yAs$) in the thickness of 0.1 (um); 14 is a clad layer consisting of the P-type gallium-aluminum-arsenide ($Ga_{1-x}Al_xAs$) in the thickness of 1 (um); 15 is an ohmic contact layer consisting of the P-type gallium-arsenide (GaAs) in the thickness of 1 (um).

To form these semiconductor layers, the well-known liquid phase epitaxial growth method using the N-type gallium-arsenic 11 as a substrate can be adopted.

Moreover, a gold(Au)-germanium(Ge)-nickel(Ni) alloy layer 16 is formed in the thickness of 5000(Å) and a gold layer 17 is then formed covering the alloy layer 16 in the thickness of 1 (um). On the surface of P-type gallium-arsenic layer 15, a titanium (Ti) layer 18 in the thickness of 700(Å) and a platinum (Pt) layer 19 in the thickness of 600(Å) are formed. Finally, a gold layer 20 in the thickness of 1 (um) is formed thereon. These metallized layers are formed by the well-known vacuum evaporation or plating methods.

A semiconductor laser element having such a structure has dimensions, for example, of 300 (um) in length, 300 (um) in width and 100 (um) in thickness, and outputs a laser beam from the active layer 13 exposed to the cleavage plane when a forward current is applied across the electrodes 17 and 20.

It is also possible, in order to define the laser beam emitting width on active layer 13, that the P-type ohmic contact layer 15 be replaced by an N-type ohmic contact layer, for example, and zinc (Zn) be selectively diffused from the surface to the depth reaching the P-type clad layer 14. Therefore, the active layer facing the zinc-diffused area is used as the laser beam emitting region.

Figure 2:
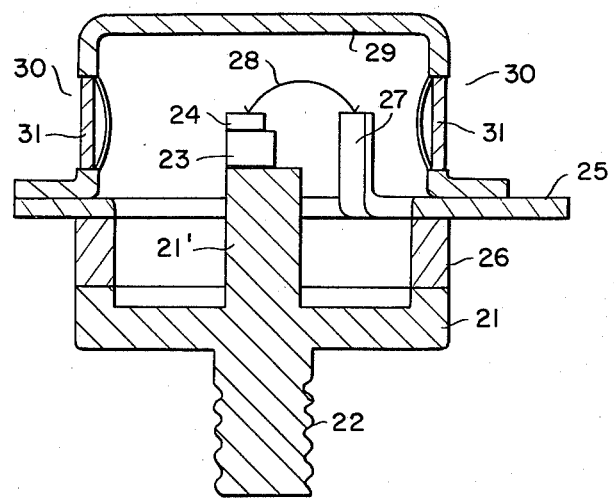
FIG. 2 is a cross section of a typical semiconductor laser device accommodating the semiconductor laser element.

A semiconductor laser element having the above structure can be accommodated in the typical case shown in FIG. 2, to form a semiconductor laser device.

In FIG. 2, reference numeral 21 is a heat radiation stud which is composed of copper (Cu) and provided with mounting screw 22 at the lower side; 23 is a diamond heat sink bonded to the top of projection 21' of the heat radiation stud 21; 24 is a semiconductor laser element bonded to the heat sink 23. In addition, 25 is a flange comprising, for example, a cover bonded to the heat radiation stud 21 via a ceramic material 26; 27 is a vertical part of the flange 25 being connected with one electrode of the semiconductor laser element 24 by means of a lead wire 28. Moreover, 29 is a sealing cap which is welded to the flange 25, such as by resistance welding method, in order to hermetically seal semiconductor laser element 24 and is provided with a window 30 for extracting a laser beam generated from the semiconductor laser element. The window has its circumference sealed by sapphire 31.

The present invention offers an improved method for bonding a semiconductor laser element 24 to a heat sink 23 which in turn is bonded to the above mentioned heat radiation stud 21.

Figure 3:
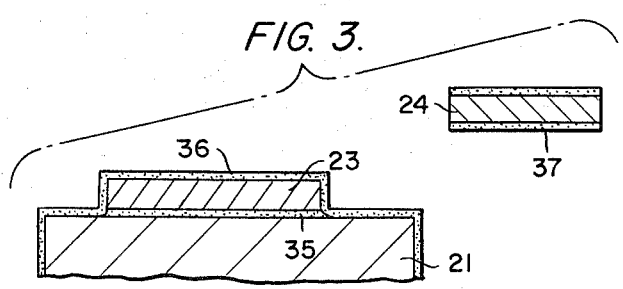
FIGS. 3 through 5 illustrate the steps of the bonding process of the present invention.
Figure 4:
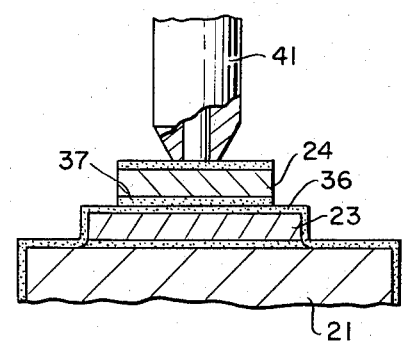
Figure 5:
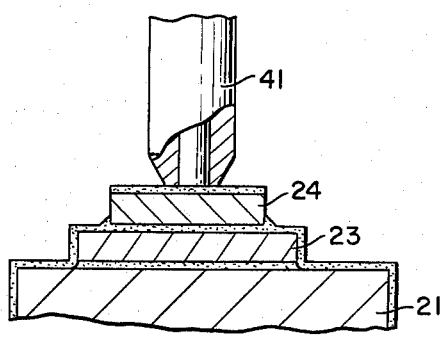

FIGS. 3 to 5 show an embodiment of a method of manufacturing a semiconductor laser device of the present invention. In FIGS. 3, 4, and 5, the parts corresponding to those also shown in FIG. 2 are given the same reference number as in FIG. 2.

In the first embodiment, the gold (Au)-tin (Sn) alloy is the alloy used as the bonding material to bond the semiconductor laser element 24 to the heat sink 23.

Initially, a diamond heat sink 23 with typical dimensions of 0.7 mm vertical, 0.7 mm horizontal and 0.4 mm high, with a layer of chromium (Cr) and a layer of platinum (Pt) on its surface, is bonded to the top of the heat radiation stud 21 by means of the bonding materials 35 comprising gold-silicon (Si). Then, the gold-tin alloy layer 36 is formed by the vacuum evaporation method to the thickness of 2 um on the surface of the heat sink 23. Simultaneously, such alloy layer is also formed on the surface of the heat radiation stud 21 in addition to that formed on the surface of the heat sink 23.

The vacuum evaporation alloy, gold-tin 36, comprises 20% (by weight) tin, and is commercially available.

In a separate manufacturing step, the bonding surface of the semiconductor laser element 24 is coated with a gold layer 37 (or 20 in FIG. 1) to a predetermined thickness, for example, 1 um. The coated element 24 will then be bonded, as shown in FIG. 1, through the vacuum evaporation method or a combination of the vacuum evaporation method and plating method.

The heat radiation stud 21 is then fixed on the hot plate of a heater (not illustrated) by the vacuum absorption method. The heat radiation stud 21 and the heat sink 23 bonded to the heat radiation stud 21 are initially heated up to 200° C., by applying a current to the resistance material of the hot plate.

At this temperature, a semiconductor laser element 24, held to a vacuum collet 41, is placed on the gold-tin alloy layer 36 coating the surface of heat sink 23 and pressed thereto by the vacuum collet 41. While, maintaining this condition, the temperature of the hot plate is raised at a rate of 12° C./sec. Thus, the heat radiation stud 21, heat sink 23 and semiconductor laser element 24 are heated up to the eutectic point temperature of the gold-tin alloy layer of 280° C. or more, to 400° C. for this embodiment.

When a temperature exceeds the eutectic point, the gold-tin alloy fuses.

In this embodiment, as the temperature nears the eutectic point temperature of the gold-tin alloy layer, ultrasonic wave vibrations are applied to the vacuum collet 41. This promotes fusing and alloy-metallization of the gold-tin layer. The time to heat the layer from the eutectic point temperature to the maximum temperature of 400° C., is 8 seconds. Application of such ultrasonic wave vibration greatly simplifies the manufacturing processes. When the temperature reaches 400° C., this temperature is maintained for several seconds and then heating is suspended, and the embodiment is cooled to room temperature.

As a result of this process, a semiconductor laser element 24 is bonded on a heat sink 23 as shown in FIG. 5.

On reaching room temperature, the vacuum collet 41 is removed, and integrated heat radiation stud 21, heat sink 23 and semiconductor laser element 24 are taken from the heater.

The other electrode (the gold layer 17 in FIG. 1) of the semiconductor laser element 24 and the external lead-out terminal (vertical part 27 in FIG. 2) which is vertically provided above the heat radiation stud 21 via the insulator support made of the ceramic material 26, etc., are connected with a lead wire, such as a gold wire, (the lead wire 28 in FIG. 2) by a conventional method.

Next, a metal cap (sealing cap 29 in FIG. 2) is arranged on the heat radiation stud covering the semiconductor laser element, and the semiconductor laser element is hermetically sealed by welding the metal cap and flange (flange 25 in FIG. 2) into an integrated form, in a nitrogen gas ambient atmosphere.

In the second embodiment, the method of the first embodiment is followed except that the ultrasonic waves are not applied to the vacuum collet 41. Also, the time period from the stop of heating and start of cooling is 60 seconds.

Even with this heating process, a bonding condition the same as that of the first embodiment can be obtained.

In the third embodiment, a gold (Au)-germanium(Ge) alloy is used as the bonding material to bond semiconductor laser element 24 to heat sink 23.

Initially, diamond heat sink 23 having typical dimensions of 0.7 mm vertical, 0.7 mm horizontal, 0.4 mm high, with a layer of chromium (Cr) and a layer of platinum (Pt) on its surface, is bonded on top of the heat radiation stud 21 using the bonding material 35 consisting of the gold-silicon (Si). Next, the gold-germanium alloy layer 36 is formed, on the surface of the heat sink, by the vacuum evaporation method to a thickness of 2 um. During this step, the alloy layer 36 is also formed on the surface of heat sink 23.

The vacuum evaporation material is a gold-germanium alloy consisting of 12% by weight, of germanium and is commercially available.

In a separate manufacturing step, the gold layer 37 (20 in FIG. 1) is formed on the bonding surface of semiconductor laser element 24, as shown in said FIG. 1. The layer is formed by the vacuum evaporation method or a combination of the vacuum evaporation and plating methods, to a desired thickness, for example, 1 um.

Heat radiation stud 21 is then fixed on the hot plate of a heater (not illustrated) by the vacuum absorption method. The heat radiation stud 21 and the heat sink 23 bonded on the heat radiation stud 21 are heated to a temperature of 200° C. by applying a current to the resistance material of the hot plate.

At this temperature, a semiconductor laser element 24, held by the vacuum collet 41 as shown in FIG. 4, is placed on the gold-germanium alloy layer 36 coating the surface of the heat sink 23 and is pressed thereto by the vacuum collet 41. While maintaining this condition, the temperature of the hot plate is increased at a rate of 12° C./sec. The heat sink 23 and semiconductor laser element 24 are heated to a temperature higher than the eutectic point temperature, 356° C., of the gold-germanium alloy layer, namely up to 420° C. for this embodiment. When a temperature exceeds the eutectic temperature, the gold-germanium alloy fuses.

In this embodiment, as the temperature nears the eutectic point temperature of the gold-germanium alloy layer, ultrasonic wave vibrations are applied to the vacuum collet 41. This promotes fusing and alloy metallization of the gold-germanium. The period for heating from the eutectic point temperature to 420° C. is 10 seconds. Application of such ultrasonic wave vibration greatly simplifies the manufacturing processes. When the temperature reaches 420° C., such temperature is maintained for several seconds, then heating is suspended and the fused layer is cooled to room temperature.

As a result of this process, semiconductor laser element 24 is bonded to heat sink 23 as shown in FIG. 5.

Thereafter, the relevant semiconductor laser element is hermetically sealed within a vessel as in the case of the first embodiment.

In the present invention's method of manufacturing a semiconductor laser device, the heat radiation stud 21 fixed on the hot plate and the heat sink bonded to said heat radiation stud 21, are heated up to a temperature in the range of 30° C. to 250° C., preferably 100° to 250° C. prior to bonding of the semiconductor laser element. This preliminary heating of the heat radiation stud and heat sink is very useful in the manufacturing process because the period up to bonding of the semiconductor laser element can be reduced.

The rate of temperature rise from the preheating temperature to a temperature higher than the eutectic point of the gold alloy layer for heating said heat sink and a semiconductor laser element pressed thereon can be selected within the range of 0.2° to 100° C./sec, preferably within the range of 1° to 50° C./sec. When the rate of temperature rise is less than 0.2° C./sec, the required heating time is long. This causes a reduction of laser beam output level due to contamination or oxidation of the cleavage plane of a semiconductor laser element or an increase of thermal resistance resulting from insufficient contact due to contamination or oxidation of the gold alloy layer surface. If a rate of temperature rise exceeds 100° C./sec, a thermal impact is generated, due to a difference of thermal expansion coefficients between a compound semiconductor and electrode metals forming a semiconductor laser element, thus causing a deterioration of the semiconductor laser element.

In addition, the maximum temperature during the period between the fusing of the gold alloy layer and the start of cooling, is selected within the range of 300° to 450° C. preferably, within the range of 350° to 430° C. If the maximum temperature is less than 300° C., the electrode metal in the semiconductor laser element does not sufficiently diffuse into the gold alloy layer thus creating the so-called insufficient wetting condition. This results in an increase of thermal resistance. If the maximum temperature exceeds 450° C., the electrode metal of semiconductor laser element deteriorates, and the cleavage plane is contaminated or oxidized, thus causing deterioration of the semiconductor laser element.

Moreover, the period between the fusing of the gold alloy layer and the start of cooling is selected within the range of 5 sec to 5 minutes, preferably within the range of 5 sec to 3 minutes. In order to obtain sufficient contact between the heat sink and the semiconductor laser element, there must be sufficient affinity between the gold alloy layer of the heat sink surface and the metallized layer of the semiconductor laser element. When an ultrasonic wave vibration is applied as in the first embodiment, the period can be reduced to between 5 and 15 seconds. Moreover, when the maximum heating temperature is about 300° C., the desirable period between the fusing of the gold alloy layer to the start of cooling is selected at about 5 minutes.

Comparsion of thermal resistance and operating life characteristic (aging variation of drive current) between semiconductor laser devices manufactured by means of the present invention and those manufactured using the conventional indium solder method results in the following.

Figure 6:
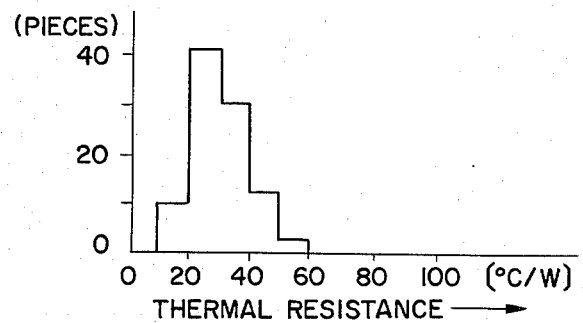
FIGS. 6 through 8 show thermal resistance distributions of a semiconductor laser device manufactured by the method of the present invention (FIGS. 6-7) and a semiconductor laser device manufactured by the existing method (FIG. 8).
Figure 7:
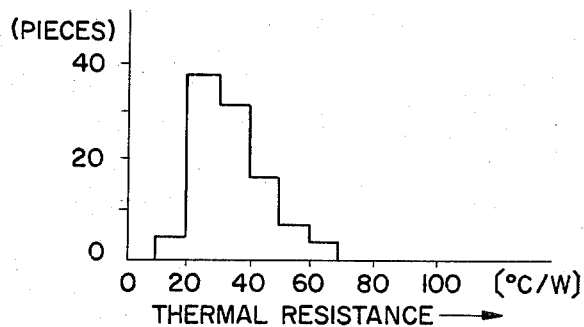
Figure 8:
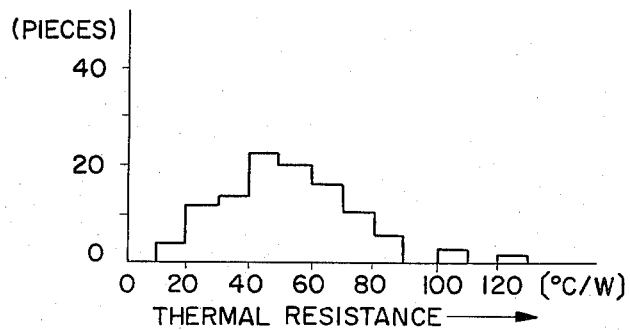

The distribution of the thermal resistances of the gold-tin alloy layer of 100 semiconductor laser elements, each bonded to a diamond heat sink by the method of the first embodiment of the present invention using the gold-tin alloy is shown in FIG. 6. The distribution of the thermal resistances of the gold-germanium alloy layer of 100 semiconductor laser elements, each bonded to a diamond heat sink by the method of the third embodiment of the present invention using the gold-germanium alloy is shown in FIG. 7. The distribution of the thermal resistances of the indium solder layer of 100 semiconductor laser elements bonded to a diamond heat sink using indium solder is shown in FIG. 8. The thickness of the indium solder coated on the heat sink, is 3 um.

As is obvious from these results, when the gold alloy is employed in the manufacturing method of the present invention, the thermal resistance is lower and distributed across a smaller range compared with the distribution obtained when the conventional indium solder is used. Thermal resistance is defined as the value obtained by dividing the deviation $(\Delta\lambda)$ in wavelength between the peak value of optical intensity of naturally emitted light generated when a pulse input is applied to the semiconductor laser element and the peak value of optical intensity of light generated when a DC voltage having the same current as the pulse input is applied to the device, by a temperature coefficient of the wavelength of emitted light previously obtained from a semiconductor material and the DC input power. Thus, the thermal resistance can be expressed by $Rt = \Delta\lambda/(d\lambda/dt) \times P$ where $d\lambda/dt$ is the temperature coefficient of the wavelength measured in units of wavelength/°C., and P is the DC input power measured in watts (W).

A semiconductor laser device manufactured using a method of the present invention, is operated at a specified output per single end of semiconductor laser element of 5 mW under the ambient temperature of 70° C. The aging variation of thermal resistance of the bonding material and aging variation of drive current of the semiconductor laser device are shown in FIG. 9 and FIG. 10, respectively.

Figure 9:
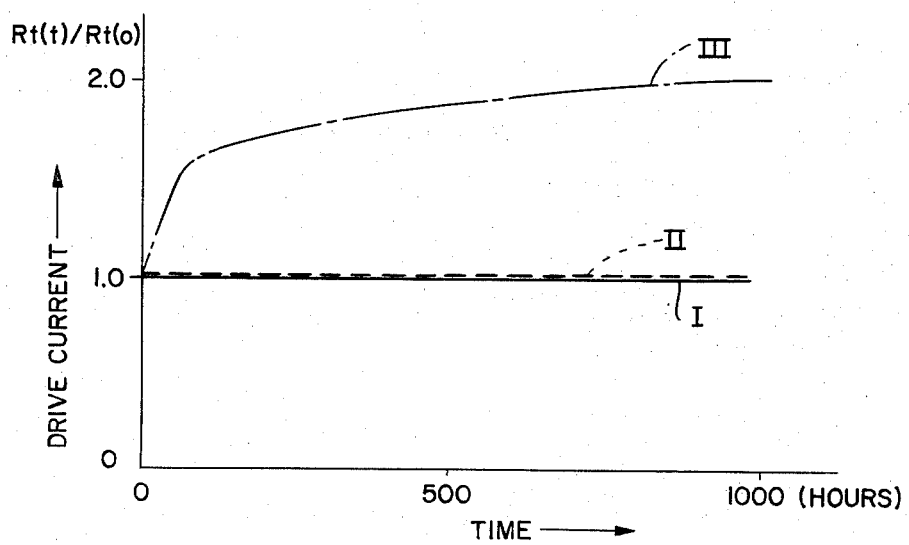
FIG. 9 shows the variations in value of thermal resistance due to aging, in a semiconductor laser device manufactured by the method of the present invention (curves I and II) and a semiconductor laser device manufactured by the existing method (curve III).
Figure 10:
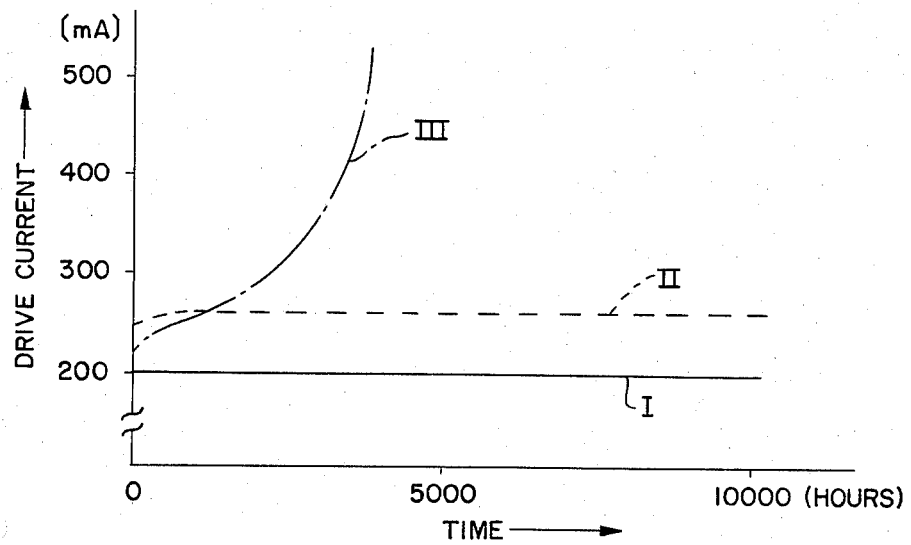
FIG. 10 shows the variation of drive currents due to aging, in a semiconductor laser device manufactured by the method of the present invention (curves I and II) and a semiconductor laser device manufactured by the existing method (curve III).

FIG. 9 shows the aging variation of thermal resistance (ratio of thermal resistance $R_t(t)$ after the specified period to the initial value $R_t(0)$; $R_t(t)/R_t(0)$. FIG. 10 shows aging variation of drive current. In both figures, curve I indicates the characteristics when gold-tin alloy is used for bonding, curve II indicates the characteristics when gold-germanium alloy is used for bonding, and curve III indicates the characteristics when indium solder is used.

As is obvious from these results, when the gold alloy layer is used in the manufacturing method of the present invention, thermal resistance values have only a small variation, after 1000 hours, and the drive current values vary by a maximum of only 5 (%) even after 10,000 hours. On the other hand, when the indium solder is used, both the thermal resistance and drive current vary greatly, by as much as 2 times the initial values, even after a short operating time. Additionally, to test the improvement inoperational life, 20 semiconductor laser devices with the semiconductor laser element bonded to a diamond heat sink using a gold-tin alloy and the manufacturing method of the present invention, and another 20 semiconductor laser devices with the semiconductor laser element bonded using the indium solder and the present invention's method, were operated for 2,000 hours at an output per single end of semiconductor laser element of 5 (mW) under an ambient temperature of 70° C.

As a result of the test, 19 elements among those using the gold-tin alloy layer remained operational, while only eight elements among those using the indium solder remained operational.

As is clear from the above results, a semiconductor laser device formed by the manufacturing method of the present invention results in a lower thermal resistance of the bonding material used to bond the semiconductor laser element to the heat sink and no aging variation. Therefore, there is very little drive current aging variation and the operating life of the device is drastically improved.

The improvement resulting from the manufacturing method of the present invention is significant when it is compared with the existing bonding method using the indium solder. Moreover, it is clear from the results shown in FIG. 9 and FIG. 10 that the bonding material used in the manufacturing method of the present invention does not degrade the operating life of a semiconductor laser element by inducing a mechanical distortion.

Even with the existing bonding method where, for example, a gold layer is formed on the bonding surface of the semiconductor laser element and a multilayered metallized layer is formed on the surface of the heat sink, the method of the present invention greatly reduces the manufacturing processes and improves the operating life of the semiconductor laser device. These improvements result from the lower thermal resistance of bonding material and no aging variation of the material.

In the above embodiments of the invention, a diamond heat sink is used. But this invention can also be adapted to use heat sinks composed of copper or silver material.

I claim:

1. A method of manufacturing a semiconductor laser device having a semiconductor laser element bonded to a heat sink comprising the steps of:
   (a) forming a metallized layer on a surface of said laser element, to be bonded to said heat sink;
   (b) forming a gold alloy layer on a surface of said heat sink, to be bonded to said laser element;
   (c) heating said heat sink to a predetermined temperature lower than the eutectic point temperature of said gold alloy layer;
   (d) contacting said metallized layer of said laser element with said gold alloy layer of said heat sink;
   (e) heating said laser element and said heat sink in contact with said laser element to a temperature higher than the eutectic point temperature of said gold alloy layer for fusing said gold alloy layer; and
   (f) cooling said laser element and said heat sink in contact with said laser element to a predetermined final temperature, whereby said laser element is bonded to said heat sink.

2. A method of manufacturing a semiconductor laser device according to claim 1, wherein in step (b) said gold alloy layer comprises an alloy selected from a group consisting of gold-tin alloy, gold-germanium alloy, gold-antimony alloy, and gold-silicon alloy.

3. A method of manufacturing a semiconductor laser device according to claim 1, wherein in step (c) said temperature lower than the eutectic point temperature of said gold alloy is within a temperature range of from 30° C. to 250° C.

4. A method of manufacturing a semiconductor laser device according to claim 1, wherein in step (e) the heating of said laser element in contact with said heat sink is at a predetermined rate within the range of 0.2° C. per second to 100° C. per second.

5. A method of manufacturing a semiconductor laser device according to claim 1, wherein in step (e) said temperature higher than the eutectic point temperature of said gold alloy layer is within a temperature range of from 300° C. to 450° C.

6. A method of manufacturing a semiconductor laser device according to claim 1, wherein in step (e) the temperature is maintained higher than the eutectic point temperature for a predetermined time and wherein the time between said fusing of said gold alloy and the start of cooling is selected within the range of from five (5) seconds to five (5) minutes.

7. A method of manufacturing a semiconductor laser device according to claim 2, 3, 4, 5 or 6, which further comprises the step of: applying ultrasonic wave vibrations to said semiconductor laser element while said laser element and said heat sink in contact with said laser element are heated to a temperature higher than the eutectic point temperature of the gold alloy layer.

8. A method of manufacturing a semiconductor laser device according to claim 7, wherein in step (e) the time between said fusing of said gold alloy and the start of cooling is selected within the range of from five (5) seconds to fifteen (15) seconds.

9. A method of manufacturing a semiconductor laser device according to claim 1, which further comprises the step of:
    applying ultrasonic wave vibrations to said semiconductor laser element while said laser element and said heat sink in contact with said laser element are heated to a temperature higher than the eutectic point temperature of the gold alloyed layer.

10. A method of manufacturing a semiconductor laser device according to claim 2 or 9, wherein said gold alloy comprises metal, approximately 20% by weight, alloyed with gold, whereby said gold alloy is formed.

11. A method of manufacturing a semiconductor laser device according to claim 1, 2, 3, 4, 5, 6 or 9, wherein in step (a) said metallized layer comprises gold.

12. A method of manufacturing a semiconductor laser device according to claim 11, wherein the thickness of said metallized layer is approximately one micrometer.

13. A method of manufacturing a semiconductor laser device according to claim 1, 2, 3, 4, 5, 6 or 9, wherein in step (f) cooling is performed to a predetermined final temperature selected to be room temperature.

14. A method of manufacturing a semiconductor laser device according to claim 1, 2, 3, 4, 5, 6 or 9, wherein said heat sink comprises a diamond.

15. A method of manufacturing a semiconductor laser device according to claim 1, 3, 4, 5, 6 or 9, wherein in step (b) said gold alloy layer comprises gold-tin having a thickness of approximately two $\mu m$, in step (d) the temperature lower that the eutectic point temperature of said gold alloy layer is selected to be approximately 200° C., in step (c) said laser element and said heat sink in contact with said laser element are heated to approximately 280° C., at a rate of about 12° C. per second, in step (e) said laser element and said heat sink in contact with said laser element are then heated to approximately 400° C. in approximately eight seconds, and said 400° C. temperature is maintained for several seconds, and said laser element bonded to said heat sink are then cooled in step (f) to room temperature.

16. A method of manufacturing a semiconductor laser device according to claim 1, 3, 4, 5, 6 or 9, wherein in step (b) said gold alloy layer is gold-germanium having a thickness of approximately 2 $\mu m$, in step (c) said temperature lower than the eutectic point temperature of said gold alloy layer is selected to be approximately 200° C., in step (e) said laser element and said heat sink in contact with said laser element are heated to approximately 356' C. at a rate of about 12° C. per second, said laser element and said heat sink in contact with said laser element are then heated to approximately 420° C.

in about ten seconds, and said 420° C. temperature is maintained for several seconds, and said laser element bonded to said heat sink are then cooled in step (f) to room temperature.

17. A method of manufacturing a semiconductor laser device according to claim 1, 2, 3, 4, 5, 6 or 9, which further comprises the step of:
   maintaining said temperature higher than the eutectic point temperature for a predetermined time, before cooling said laser element and said heat sink in contact with said laser element.

18. A method of manufacturing a semiconductor laser device having a heat radiation stud, according to claim 1, 2, 3, 4, 5 or 9, which further comprises the steps of:
   forming a metallized layer on the surface of the heat radiation stud, and bonding said heat sink to said heat radiation stud.

19. A method of manufacturing a semiconductor laser device according to claim 18, wherein said metallized layer formed on the heat radiation stud comprises a gold alloy selected from a group consisting of gold-tin alloy, gold-germanium alloy, gold-antimony alloy, and gold-silicon alloy.

* * * * *

UNITED STATES PATENT AND TRADEMARK OFFICE
CERTIFICATE OF CORRECTION

PATENT NO. : 4,360,965
DATED : November 30, 1982
INVENTOR(S) : Fujiwara

It is certified that error appears in the above-identified patent and that said Letters Patent is hereby corrected as shown below:

Col. 1, line 41, "provides" should be --providing--;

Col. 3, lines 61, 63, 68, "arsenide" should be --arsenic--;
        line 65, "nide" should be --nic--.

Col. 7, line 28, "thus" should be --, thus--.

Col. 8, line 8, after "used." begin a new paragraph
        with --Thermal--;

line 33, before "." insert --)--;
        line 43, after "variation," insert --even--;
        line 49, "inoperational" should be --in operational--.

UNITED STATES PATENT AND TRADEMARK OFFICE
CERTIFICATE OF CORRECTION

PATENT NO. : 4,360,965

DATED : November 30, 1982

INVENTOR(S) : Fujiwara

It is certified that error appears in the above-identified patent and that said Letters Patent is hereby corrected as shown below:

Col. 10, line 46, "(d)" should be --(c)--;
line 49, "(c)" should be --(d)--;
line 66, "356'C." should be --356°C.--.

Signed and Sealed this

Thirteenth Day of September 1983

[SEAL]

Attest:

GERALD J. MOSSINGHOFF

Attesting Officer    Commissioner of Patents and Trademarks